United States Patent
Singh

(10) Patent No.: US 8,456,560 B2
(45) Date of Patent: Jun. 4, 2013

(54) WAFER LEVEL CAMERA MODULE AND METHOD OF MANUFACTURE

(75) Inventor: Harpuneet Singh, Dublin, CA (US)

(73) Assignee: DigitalOptics Corporation, San Jose, CA (US)

( * ) Notice: Subject to any disclaimer, the term of this patent is extended or adjusted under 35 U.S.C. 154(b) by 477 days.

(21) Appl. No.: 11/698,776

(22) Filed: Jan. 26, 2007

(65) Prior Publication Data

US 2008/0180566 A1   Jul. 31, 2008

(51) Int. Cl.
*G02B 13/16* (2006.01)
*H04N 5/225* (2006.01)
*H01L 31/0203* (2006.01)

(52) U.S. Cl.
USPC ............................ 348/335; 348/374; 257/433

(58) Field of Classification Search
USPC .................. 348/335, 340, 373–376; 257/432, 257/433
See application file for complete search history.

(56) References Cited

U.S. PATENT DOCUMENTS

| | | | |
|---|---|---|---|
| 4,345,021 A | 8/1982 | Ogawa et al. | 430/321 |
| 5,866,942 A | 2/1999 | Suzuki et al. | |
| 5,912,872 A | 6/1999 | Feldman et al. | |
| 6,096,155 A | 8/2000 | Harden et al. | 156/250 |
| 6,235,141 B1 | 5/2001 | Feldman et al. | 156/250 |
| 6,256,155 B1 | 7/2001 | Nagaoka | 359/753 |
| 6,285,064 B1 | 9/2001 | Foster | |
| 6,295,156 B1 | 9/2001 | Feldman et al. | 359/280 |
| 6,324,010 B1 | 11/2001 | Bowen et al. | 359/622 |
| 6,374,004 B1 | 4/2002 | Han et al. | 385/14 |
| 6,406,583 B1 | 6/2002 | Harden et al. | 156/250 |
| 6,407,381 B1 | 6/2002 | Glenn et al. | |
| 6,426,829 B1 | 7/2002 | Feldman et al. | 359/280 |
| 6,451,150 B2 | 9/2002 | Feldman et al. | 156/250 |
| 6,483,627 B2 | 11/2002 | Feldman et al. | 359/280 |
| 6,528,857 B1 | 3/2003 | Glenn et al. | |
| 6,566,745 B1 | 5/2003 | Beyne et al. | |
| 6,649,008 B2 | 11/2003 | Feldman et al. | 156/250 |
| 6,669,803 B1 | 12/2003 | Kathman et al. | 156/250 |
| 6,777,311 B2 | 8/2004 | Han et al. | 438/462 |
| 6,836,382 B2 * | 12/2004 | Ning | 359/793 |
| 6,873,024 B1 | 3/2005 | Prabhu et al. | |

(Continued)

FOREIGN PATENT DOCUMENTS

| | | |
|---|---|---|
| CN | 1517736 A | 8/2004 |
| CN | 1682377 A | 10/2005 |

(Continued)

OTHER PUBLICATIONS

Definiton of "opposite"; Merriam-Webster's Collegiate Dictionary 10th edition, copyright 2001.*

(Continued)

*Primary Examiner* — Daniel M Pasiewicz
(74) *Attorney, Agent, or Firm* — Larry E. Henneman, Jr.; Gregory P. Gibson; Henneman & Associates, PLC

(57) ABSTRACT

A method includes forming optical lenses on an ICD at the wafer level, rather than attaching a separate lens assembly. The lenses may be formed as an array of individual lenses or as multiple, e.g., two, arrays of individual lenses. The array of lenses may be coupled to an array of ICDs. The ICDs and individual lenses in the array assembly may be singulated to form individual digital camera modules. Additionally or alternatively, the ICDs and individual lenses may be singulated in separate steps.

23 Claims, 4 Drawing Sheets

U.S. PATENT DOCUMENTS

| | | | |
|---|---|---|---|
| 6,885,107 B2 | 4/2005 | Kinsman | |
| 6,954,311 B2 | 10/2005 | Amanai | |
| 7,091,599 B2 | 8/2006 | Fujimori | |
| 7,129,146 B2 | 10/2006 | Hsu | 438/401 |
| 7,169,645 B2 | 1/2007 | Bolken et al. | |
| 7,199,438 B2 | 4/2007 | Appelt et al. | |
| 7,205,095 B1 | 4/2007 | Prabhu et al. | |
| 7,242,433 B2 | 7/2007 | Tanaka et al. | |
| 7,265,916 B2 | 9/2007 | Kimura | |
| 7,593,057 B2 | 9/2009 | Yee et al. | |
| 7,688,382 B2 | 3/2010 | Nishida et al. | |
| 7,939,901 B2 | 5/2011 | Minamio et al. | |
| 2002/0094198 A1 | 7/2002 | Uchiyama | 396/25 |
| 2003/0218251 A1 | 11/2003 | Seo | |
| 2004/0077121 A1 | 4/2004 | Maeda et al. | |
| 2004/0212719 A1* | 10/2004 | Ikeda | 348/340 |
| 2005/0073602 A1 | 4/2005 | Kamoda et al. | 348/335 |
| 2005/0077458 A1* | 4/2005 | Ma et al. | 250/239 |
| 2005/0110107 A1* | 5/2005 | Yamamoto et al. | 257/433 |
| 2005/0185088 A1 | 8/2005 | Kale et al. | |
| 2005/0237418 A1 | 10/2005 | Sakamoto | |
| 2005/0285016 A1 | 12/2005 | Kong et al. | |
| 2006/0006511 A1 | 1/2006 | Roh et al. | |
| 2006/0019428 A1 | 1/2006 | Kurosawa et al. | |
| 2006/0044450 A1 | 3/2006 | Wolterink et al. | |
| 2006/0054782 A1 | 3/2006 | Olsen et al. | 250/208.1 |
| 2006/0066945 A1 | 3/2006 | Yeo et al. | 359/457 |
| 2006/0132644 A1 | 6/2006 | Shangguan et al. | |
| 2006/0139776 A1 | 6/2006 | Mori et al. | 359/819 |
| 2006/0204243 A1* | 9/2006 | Tsai | 396/529 |
| 2007/0091198 A1 | 4/2007 | Watanabe et al. | |
| 2007/0126898 A1* | 6/2007 | Feldman et al. | 348/294 |
| 2007/0166029 A1 | 7/2007 | Lee et al. | |
| 2007/0236591 A1 | 10/2007 | Tam et al. | |
| 2008/0136956 A1* | 6/2008 | Morris et al. | 348/340 |
| 2008/0143864 A1 | 6/2008 | Yamaguchi et al. | |
| 2008/0278617 A1 | 11/2008 | Tanida et al. | |
| 2009/0015706 A1 | 1/2009 | Singh | |
| 2009/0027869 A1 | 1/2009 | Uchida et al. | |
| 2009/0213262 A1 | 8/2009 | Singh et al. | |
| 2009/0243051 A1 | 10/2009 | Vanam et al. | |
| 2010/0053423 A1 | 3/2010 | Singh | |
| 2011/0037886 A1 | 2/2011 | Singh | |
| 2011/0096213 A1 | 4/2011 | Hasegawa | |

FOREIGN PATENT DOCUMENTS

| | | |
|---|---|---|
| EP | 1387397 A2 | 2/2004 |
| EP | 1443754 A2 | 4/2004 |
| JP | 08-064556 | 3/1996 |
| JP | 2004-040287 A | 2/2004 |
| JP | 2004-088713 A | 3/2004 |
| JP | 2004-207461 A | 7/2004 |
| JP | 2005-056999 A | 3/2005 |
| JP | 2005-216970 A | 8/2005 |
| WO | WO2004/027880 A2 | 4/2004 |
| WO | WO 2006/035963 | 4/2006 |
| WO | WO 2007/120587 | 10/2007 |
| WO | WO 2011/019409 | 2/2011 |

OTHER PUBLICATIONS

Definition of "opposite"; Dictionary.com accessed May 17, 2012. http://dictionary.reference.com/browse/opposite?s=t.*

PCT Application No. PCT/US2008/001083, International Search Report and Written Opinion dated Jul. 18, 2008.

PCT Application No. PCT/US2008/001083, International Preliminary Report on Patentability dated Aug. 6, 2009.

U.S. Appl. No. 11/402,196, Office Action dated Nov. 15, 2007.

U.S. Appl. No. 11/402,196, Restriction Requirement dated Aug. 15, 2008.

U.S. Appl. No. 11/402,196, Office Action dated Mar. 5, 2009.

U.S. Appl. No. 11/402,196, Office Action dated Nov. 13, 2009.

PCT Application No. PCT/US2007/008668, International Search Report and Written Opinion dated Nov. 4, 2008.

PCT Application No. PCT/US2007/008668, International Preliminary Report on Patentability dated Dec. 31, 2008.

U.S. Appl. No. 60/859,519, coversheet, specification, claims, and drawings filed Nov. 17, 2006.

U.S. Appl. No. 11/402,196, Office Action dated Jul. 9, 2010.

EP App. No. 07755070.5, European Search Report dated Sep. 9, 2010.

EP App. No. 07755070.5, Office Action dated Sep. 28, 2010.

CN Application No. 200880009978.7, Office Action dated Apr. 8, 2011 (English translation).

U.S. Appl. No. 11/402,196, Office Action dated Mar. 30, 2011.

PCT Application No. PCT/US2010/002251, International Search Report and Written Opinion dated Oct. 4, 2010.

CN Application No. 200880009978.7, Office Action dated Apr. 24, 2012 (English translation).

CN Application No. 200880009978.7, Office Action dated Aug. 20, 2012 (English translation).

JP Application No. 2009-547318, Office Action dated Jul. 2, 2012 (English translation).

U.S. Appl. No. 12/583,193, Office Action dated Jan. 18, 2012.

U.S. Appl. No. 12/583,193, Office Action dated Oct. 12, 2012.

PCT Application No. PCT/US2010/002251, IPRP dated Feb. 23, 2012.

U.S. Appl. No. 11/402,196, Office Action dated Nov. 15, 2011.

U.S. Appl. No. 11/402,196, Office Action dated Jun. 19, 2012.

JP Application No. 2009-505406, Office Action dated Nov. 5, 2012.

* cited by examiner

WAFER LEVEL CAMERA MODULE AND METHOD OF MANUFACTURE

BACKGROUND

1. Technical Field

This invention relates generally to digital cameras, and more particularly to digital camera modules mountable in host devices.

2. Description of the Background Art

Digital camera modules are currently being incorporated into a variety of host devices. Such host devices include cellular telephones, personal data assistants (PDAs), computers, etc. And, consumer demand for digital camera modules in host devices continues to grow.

Host device manufacturers prefer digital camera module to be small, so that they can be incorporated into the host device without increasing the overall size of the host device. Further, host device manufacturers desire camera modules that minimally affect host device design. Further, camera module and host device manufacturers want the incorporation of the camera modules into the host devices not to compromise image quality.

A conventional digital camera module generally includes a lens assembly, a housing, a printed circuit board (PCB), and an integrated image capture device (ICD). Typically, the components are formed separately and later assembled to create the digital camera module. That is, the ICD is attached to the PCB, and then the housing is attached to the PCB so that the ICD is covered by the bottom of the housing. The lens assembly is mounted to the opposite end of the housing to focus incident light onto an image capture surface of the ICD. The ICD is electrically coupled to the PCB, which includes a plurality of electrical contacts for the ICD to communicate image data to the host device for processing, display and storage.

ICDs are vulnerable to damage and contamination, particularly before and during the housing attachment process. For example, before the housing is attached to the PCB, the wire bonds are exposed to inadvertent contact (e.g., during handling), which can cause damage. Further, the ICD is vulnerable to contamination from particulate debris. Contamination of the sensor array (the image capture surface) may block incident light, causing visible defects in images being captured by the device. Damaged ICDs may cause a decrease in product yield and an increase in labor and material costs.

What is needed is a camera module design and method of manufacturing camera modules that reduces the chance of damaging ICDs, results in higher yield, results in a faster manufacturing throughput, is less expensive, and/or results in smaller device sizes.

SUMMARY

Embodiments of the present invention overcome problems associated with the prior art, by providing a digital camera module with lenses formed at the wafer level. Embodiments of the present invention facilitate higher yield, faster throughput, and lower manufacturing costs by eliminating the need to attach a lens assembly within a housing. In some embodiments, quality may improve due to less handling and fewer materials. Also, because the module is fabricated at the wafer level, clean room technology may be employed to reduce the risk of ICD damage or contamination. Further, in some embodiments, the overall size of the digital camera module may be reduced in all three dimensions.

In accordance with an embodiment, the present invention provides a digital camera module comprising an ICD including an imager; a first transparent element; a bonding agent coupling said ICD to said first transparent element without blocking incident light to said imager; and a second transparent element coupled to said first transparent element. In one embodiment, no portion of said first transparent element and said second transparent element extends beyond the perimeter of the ICD. The first transparent element may include a concave-convex section and said second transparent element may include a convex-concave section. The bonding agent may include a die-cut adhesive sheet and/or dispensed adhesive. The adhesive sheet and/or the dispensed adhesive may include opaque material and/or waterproof material. The first transparent element and the second transparent element may form an airgap therebetween, and said first transparent element and said ICD may form an airgap therebetween. The second transparent element may be coupled to said first transparent element via a bonding agent. The second transparent element may be coupled to said first transparent element via mechanical interaction. The mechanical interaction may include complementary interlocking features formed on said first transparent element and said second transparent element. Additional transparent elements can be added to further improve image quality.

In accordance with another embodiment, the present invention provides a digital camera module workpiece, comprising an ICD wafer including an array of ICDs; a first transparent element array including an array of first transparent elements, each first transparent element positioned over a respective one of said ICDs; and a second transparent element array including an array of second transparent elements, each second transparent element positioned over a respective one of said first transparent elements. In one embodiment, the perimeter of each first transparent element and its respective second transparent element does not extend beyond the perimeter of its respective ICD. The workpiece may further comprise metallization coupled to the ICD. The first transparent element array may be coupled to said ICD wafer via a bonding agent. The ICD wafer and first transparent element array may be backlapped. The ICD wafer may be plasma etched on the side opposite said first transparent element array to form holes for accessing bonding pads. These holes are then metallized to reposition electrical contacts on the bottom surface of the ICD, where solder balls can be attached to form a wafer level package. The second transparent element array may be coupled to said first transparent element array via a bonding agent. The second transparent element array may be coupled to said first transparent element array via mechanical interactions. The mechanical interactions may include complementary interlocking features formed on said first transparent elements and said second transparent elements. Additional interlocking transparent elements may be added to further improve image quality.

In accordance with yet another embodiment, the present invention provides a method for manufacturing digital camera modules comprising providing an ICD wafer including an array of ICDs; providing a first transparent element array including an array of first transparent elements; bonding said first transparent element array to said ICD wafer such that each ICD corresponds to a respective first transparent element; providing a second transparent element array including an array of second transparent elements; bonding said second transparent element array to said first transparent element array such that each first transparent element corresponds to a respective second transparent element; singulating said ICD wafer into individualized ICDs; singulating said first transparent element array into individualized first transparent elements; and singulating said second transparent element array into individualized second transparent elements.

Singulating said ICD wafer may be performed prior to said bonding of said second transparent element array to said first transparent element array. The method may further comprise backlapping said first transparent element array prior to bonding said second transparent element array to said first transparent element array. The method may further comprise plasma etching said ICD wafer. The plasma etching produces holes in said ICD wafer to access bonding pads. These holes are then metallized to provide electrical contacts on the bottom surface of the ICD, where solder balls may be attached to form a wafer level package. The plasma etching may also singulate said ICD wafer into individualized ICDs. The method may further comprise metalizing and patterning said individualized ICDs. Both said singulating said first transparent element array and said singulating said second transparent element array may occur after said bonding of said second transparent element array to said first transparent element array. The method may further comprise coupling at least one of said individualized ICDs to a circuit substrate via solder pad connectors.

BRIEF DESCRIPTION OF THE DRAWINGS

The present invention is described with reference to the following drawings, wherein like reference numbers denote like elements.

DETAILED DESCRIPTION

In the following description, numerous details are set forth to provide a thorough understanding of the present invention. Those skilled in the art will recognize that the present invention may depart from these details. Further, details of well-known practices and components have been omitted, so as not to unnecessarily obscure the present invention.

Embodiments of the present invention overcome problems associated with the prior art, by providing a digital camera module with lenses formed thereon at the wafer level. Embodiments of the present invention facilitate higher yield, faster throughput, and lower manufacturing costs by eliminating the need to attach the lens assembly within a housing. In some embodiments, quality may improve due to less handling and fewer materials. Also, because the module is fabricated at the wafer level, clean room technology may be employed to reduce the risk of ICD damage and/or contamination. Further, in some embodiments, the overall size of the digital camera module may be reduced, e.g., in all three dimensions.

Figure 1A:
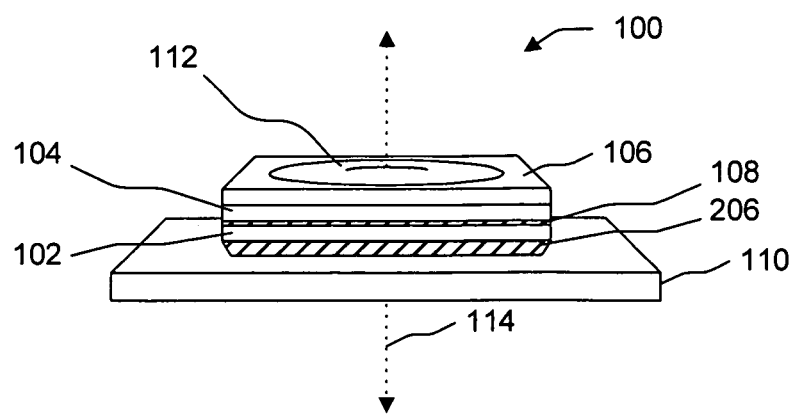
FIG. 1A is a perspective view of a digital camera module affixed to a printed circuit board (PCB), in accordance with an embodiment of the present invention.

FIG. 1A is a perspective view of a digital camera module 100 affixed to a printed circuit board (PCB) 110, in accordance with an embodiment of the present invention. Digital camera module 100 includes an ICD 102, a first transparent element 104 affixed to ICD 102, a second transparent element 106 affixed to first transparent element 104, and metallization 206 of ICD 102. First transparent element 104 may be bonded to ICD 102 via bonding agent layer 108, e.g., a die-cut adhesive sheet applied directly between the top surface of ICD 102 and the bottom surface of first transparent element 104 and/or an evenly dispensed adhesive. First transparent element 104 may be bonded to the second transparent element 106, e.g., using adhesive, mechanical interaction, etc. The metallization 206 of ICD 102 may be accomplished using conventional etching, patterning and metallization processes, and may include dielectric material. As shown, the digital camera module 100 is aligned along a focal line 114, centered with respect to ICD 102.

In one embodiment, second transparent element 106 includes a lens 112. Lens 112 may be a convex-concave lens, constructed of optical glass or other optical grade material. Although not shown, first transparent element 104 may also have a lens constructed of optical glass or other optical grade material. (See lens 116 of FIG. 1B.) Also, as shown, metallization 206 may include a perimeter wall angled inwardly, so that the perimeter of the metallization 206 does not exceed the perimeter wall of the ICD 102.

Figure 1B:
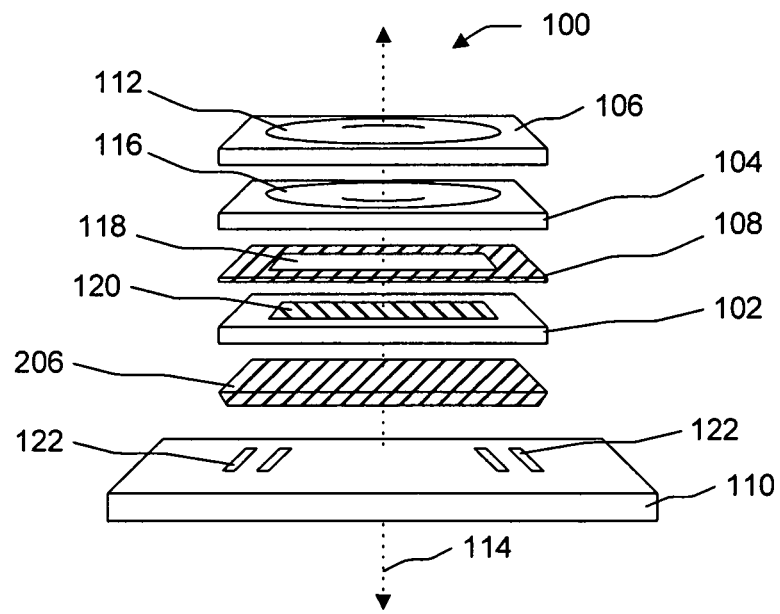
FIG. 1B is an exploded perspective view of the digital camera module relative to the PCB, in accordance with an embodiment of the present invention.

FIG. 1B is a perspective view of digital camera module 100 exploded along focal line 114 and relative to PCB 110, in accordance with an embodiment of the present invention. Digital camera module 100 includes ICD 102, metallization 206, bonding agent layer 108, first transparent element 104, and second transparent element 106.

As shown, ICD 102 includes an imager 120 capable of capturing images from incident light. In this embodiment, imager 120 includes a generally rectangular perimeter, although other perimeter shapes are possible. Bonding agent layer 108 includes aperture 118, which may have the same perimeter as the imager 120 to provide an unobstructed path for light to pass therethrough, while still allowing a bond to be formed between first transparent element 104 and ICD 102. In another embodiment, aperture 118 may have a perimeter of a different size and/or shape than imager 120. Bonding agent layer 108 may include an opaque adhesive material to block light from entering the imager 120 through areas of first transparent element 104 and/or second transparent element 106 other than through the lens elements 112 and 116. Additionally or alternatively, bonding agent layer 108 may include a waterproof adhesive to prevent vapor and/or particulate matter from contaminating air gap 204 or imager 120.

In this embodiment, first transparent element 104 includes concave-convex lens 116 (bulging outwardly towards ICD 120 and away from incoming light). Second transparent element 106 includes convex-concave lens 112 (bulging outwardly away from ICD 120 and towards incoming light). First transparent element 104 and second transparent element 106 act to focus light onto imager 120. It will be appreciated that additional transparent elements may be used, e.g., to change focus.

PCB 110 includes bonding pads 122 for electrical connection with digital camera module 100, or more specifically with ICD 102. Although not shown, metallization 206 may have a patterned and metalized underside (see FIG. 2) corresponding to bonding pads 122. In one embodiment, digital camera module 100 and PCB 110 are soldered together. One skilled in the art will recognize that other types of electrical contacts (e.g., male and female plug blocks) may be used.

Figure 2:
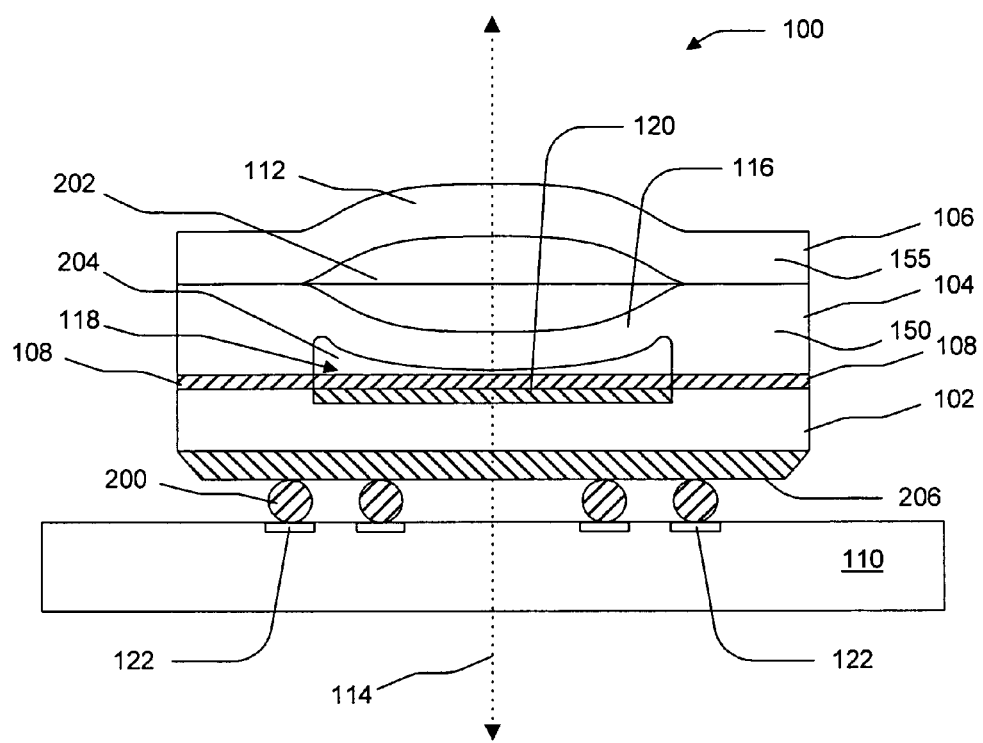
FIG. 2 is a cross-sectional view of the digital camera module affixed to the PCB, in accordance with an embodiment of the present invention.

FIG. 2 is a cross-sectional side view of the digital camera module 100 along focal line 114 relative to PCB 110, in accordance with an embodiment of the present invention. As shown, digital camera module 100 includes ICD 102, metallization 206, bonding agent layer 108, first transparent element 104, and second transparent element 106.

First transparent element 104 has a concave-convex lens element 116 and a seat portion 150, and second transparent element 106 has a convex-concave lens element 112 and a seat portion 155. In one embodiment, the perimeter of each of lens element 112 and lens element 116 is round, and the diameter of each of lens element 112 and lens element 116 is at least as long as the longest dimension of imager 120. As shown, seat portion 150 (shown in FIG. 2 as including upwardly and downwardly projecting legs) enables first transparent element 104 to rest level on ICD 102 and second transparent element 106 to rest level on seat portion 150 of first transparent element 104. Although seat portion 150 and seat portion 155 are shown as including substantially planar sections, one skilled in the art will recognize that they may have different shapes, including mechanical fit- or snap-together pieces.

When first transparent element 104 and second transparent element 106 are assembled, lens element 112 and lens element 116 form an air gap 202 therebetween. Further, since lens element 116 is disposed between the upper surface of first transparent element 104 and the lower surface of seat portion 150, lens element 116 and imager 120 also form an air gap 204 therebetween. It will be appreciated that other embodiments may not have air gaps 202 and 204. In one embodiment, one of first transparent element 104 or second transparent element 106 may have no lens focusing power at all and/or may include only a substantially planar sheet.

Solder 200, e.g., solder pads, may be used to couple digital camera module 100 to PCB 110. Solder 200 effectively couples bonding pads 122 of PCB 110 and the metallization 206, thus creating electrical connection between ICD 102 and PCB 110.

Figure 3A:
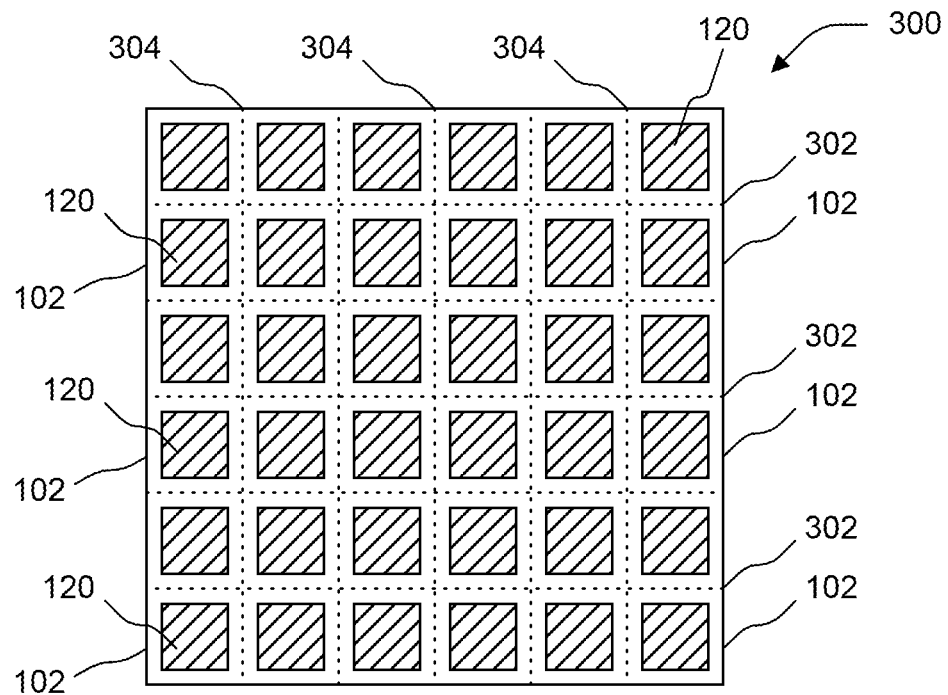
FIG. 3A is a top view of an ICD wafer, in accordance with an embodiment of the present invention.

FIG. 3A is a top view of an ICD wafer 300, in accordance with an embodiment of the present invention. As shown, ICD wafer 300 includes an array of individual ICDs 102, each including an imager 120. The individual ICDs 102 may be formed together on a wafer, and later separated during the assembly process. The outline of each ICD 102 is defined by horizontal dotted lines 302 and vertical dotted lines 304.

Figure 3B:
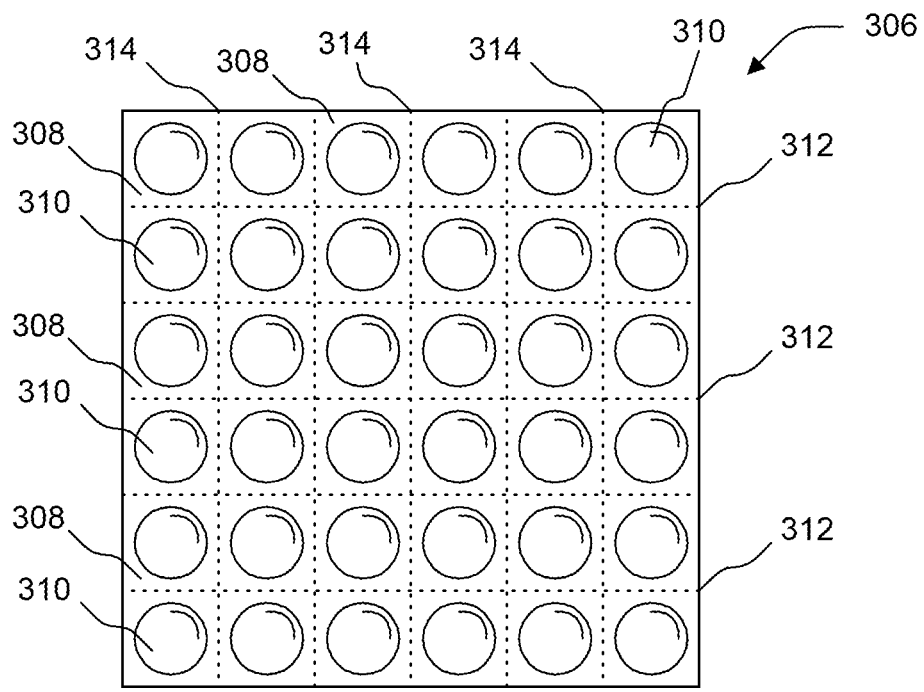
FIG. 3B is a top view of a transparent element array, in accordance with an embodiment of the present invention.

FIG. 3B is a top view of a transparent element array 306, in accordance with an embodiment of the present invention. Transparent element array 306 includes a plurality of individual transparent elements 308, each including a lens element 310. The individual transparent elements 308 may be formed together on a wafer, and later separated during the assembly process. In one embodiment, the individual transparent elements 308 are sized and/or spaced apart such that each transparent element 308 corresponds to a respective one of the individual ICDs 102 of ICD wafer 300. One skilled in the art will recognize that individual transparent elements 308 of transparent element array 306 may include first transparent elements 104 and/or second transparent elements 106. Accordingly, lens elements 310 formed thereon may be lenses 112 and/or lenses 116. The outline of each transparent element 308 is defined by horizontal dotted lines 312 and vertical dotted lines 314.

Figure 4:
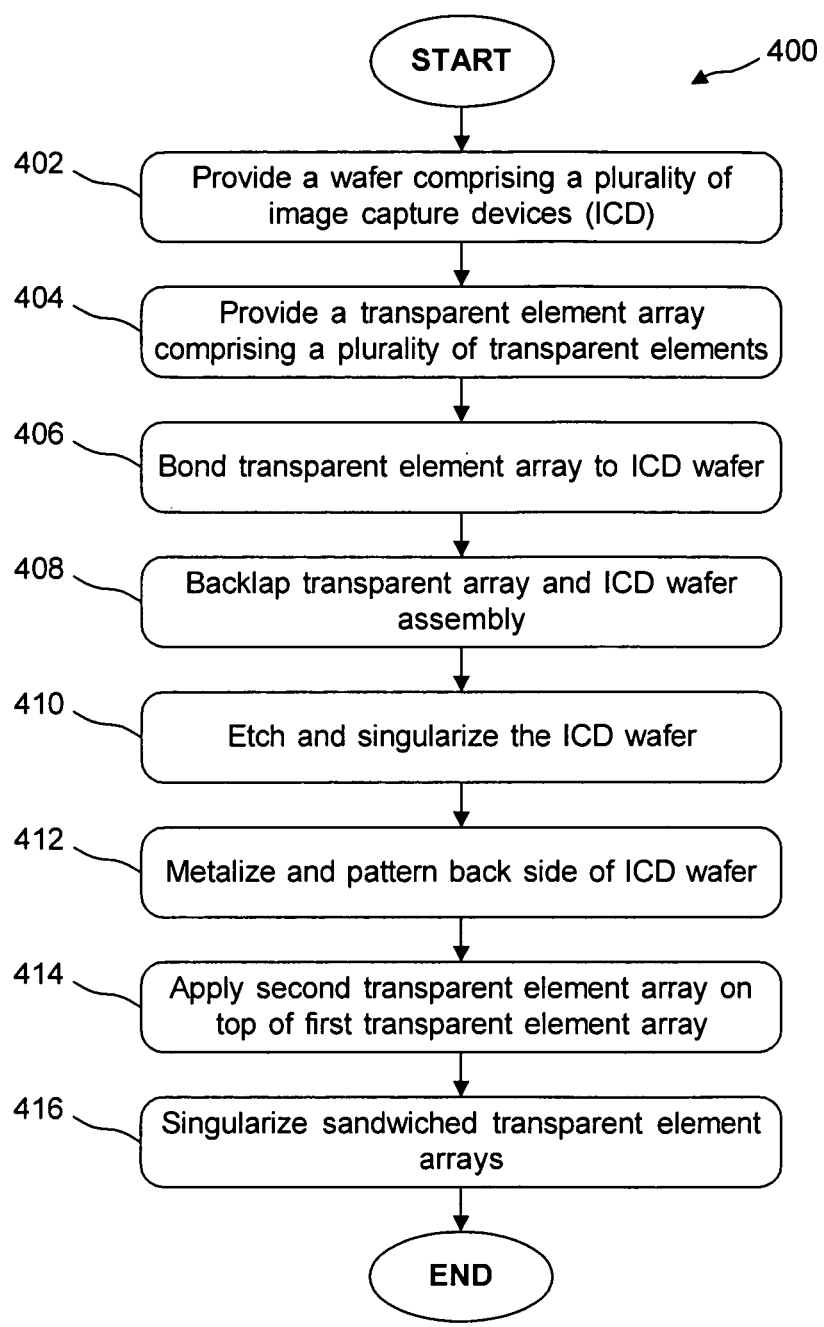
FIG. 4 is a block diagram illustrating a method of manufacturing a digital camera module at the wafer level, in accordance with an embodiment of the present invention.

FIG. 4 is a block diagram illustrating a method 400 for manufacturing a wafer level digital camera module, in accordance with an embodiment of the present invention. In step 402, an ICD wafer comprising an array of ICDs is provided. In step 404, a first transparent element array comprising an array of first transparent elements is provided. In step 406, the first transparent element array is bonded to the ICD wafer, e.g., using a bonding agent layer between the first transparent element array and the ICD wafer. In step 408, the bonded assembly is backlapped, i.e., possibly a portion of the backside (the inactive side) of the ICD wafer and possibly a portion of the topside of the first transparent element array, is removed. Backlapping planarizes one or both sides of the assembly, reduces the thickness of the assembly, removes any undesired curvature in one or both sides of the assembly, and facilitates planarity and parallelism of the top and bottom surfaces, etc. In step 410, the ICD wafer is plasma etched and singulated. The plasma etching process creates holes through the ICDs to enable electrical connection to the bonding pads on the front side of the ICDs. Plasma etching, dicing, or any other suitable means can be used for singulating the IC wafer. The singularization process individualizes the ICDs by, for example, plasma etching, laser cutting and/or mechanical cutting). At this point, the singulated ICDs may be maintained in array form by the first transparent element array. In step 412, the backside of the ICDs are patterned and metalized to create electrical connections to the ICD circuitry for connection to the PCB.

In step 414, a second transparent element array is coupled to the topside of the first transparent element array, so that a respective second transparent element of the second transparent element array is aligned with a respective first transparent element of the first transparent element array. The second transparent array may be coupled using a bonding agent, complementary mechanical interactions (e.g. fit- or snap-together pieces), or any other suitable coupling mechanism. In step 416, the first and second transparent elements of the first and second transparent element arrays are singulated, e.g., using mechanical cutting, to create individual digital camera modules.

Many of the described features may be substituted, altered or omitted without departing from the scope of the invention. For example, other lens configurations are possible, e.g., by adding or deleting lenses, by changing lens shapes, by changing optical powers, etc. Further, the ICD and PCB may be combined into a single electronic component. The order of assembly may also change. As yet another example, the steps of plasma etcheing, metallization, and solder ball attachment can be omitted, using instead a wire bonding process to electrically couple bonding pads on the top surface of the ICD (left uncovered by the transparent elements) to bonding pads on a PCB. These and other deviations from the particular embodiments shown will be apparent to those skilled in the art, in view of this disclosure.

We claim:
1. A digital camera module comprising:
an image capture device (ICD) including an imager;
a first transparent element;
a bonding agent coupling said ICD to said first transparent element;
a metallization layer on a side of said ICD opposite said first transparent element; and
a second transparent element coupled to said first transparent element;
wherein said metallization layer includes a perimeter wall angled inwardly such that the perimeter of said metallization layer does not exceed the perimeter of said ICD; and
wherein said ICD and first transparent element are backlapped to substantially planarize at least one surface of each of the ICD and the first transparent element;

wherein the surface of the ICD that has been planarized is on a side of the ICD that faces away from the first transparent element.

2. A digital camera module according to claim 1, wherein no portion of said first transparent element and said second transparent element extend beyond the perimeter of the ICD.

3. A digital camera module according to claim 1, wherein said first transparent element includes a concave-convex section and said second transparent element includes a convex-concave section.

4. A digital camera module according to claim 1, wherein said first transparent element and said second transparent element form an air gap there between, and said first transparent element and said ICD form an air gap there between.

5. A digital camera module according to claim 1, wherein said second transparent element is coupled to said first transparent element via a bonding agent.

6. A digital camera module according to claim 1, wherein said second transparent element is coupled to said first transparent element via mechanical interaction.

7. A digital camera module according to claim 6, wherein said mechanical interaction comprises complementary interlocking features formed on said first transparent element and said second transparent element.

8. A digital camera module according to claim 1, wherein said bonding agent includes an adhesive sheet.

9. A digital camera module according to claim 8, wherein said adhesive sheet includes waterproof material.

10. A digital camera module according to claim 8, wherein:
said adhesive sheet defines an aperture over said imager; and
said aperture is at least large as the larger of a perimeter of said imager and a lens portion of said transparent element.

11. A digital camera module according to claim 8, wherein:
said adhesive sheet is directly adhered to both a top surface of said ICD and a bottom surface of said first transparent element; and
said first transparent element is a lens element.

12. A digital camera module according to claim 8, wherein said adhesive sheet includes opaque material.

13. A digital camera module workpiece, comprising:
an image capture device (ICD) wafer including an array of ICDs, each said ICD including an imager;
a first transparent element array including an array of first transparent elements, each first transparent element positioned over a respective one of said ICDs; and
a second transparent element array including an array of second transparent elements, each second transparent element positioned over a respective one of said first transparent elements; and wherein
said ICD wafer includes a metallization layer defining a plurality of perimeter walls, each of said perimeter walls associated with one of said ICDs;
said metallization layer is on a side of said ICD wafer facing away from said first transparent element array;
each of said plurality of perimeter walls of said metallization layer is angled inwardly such that said each perimeter wall does not exceed the perimeter of said associated one of said ICDs; and
said ICD wafer and first transparent element array are backlapped to substantially planarize at least one surface of each of the ICD wafer and the first transparent element array;
wherein the surface of the ICD that is planarized is said side of said ICD wafer.

14. A digital camera module workpiece according to claim 13, wherein the perimeter of each first transparent element and is respective second transparent element does not extend beyond the perimeter of its respective ICD.

15. A digital camera module workpiece according to claim 13, wherein:
said ICD wafer is plasma etched on the side opposite said first transparent element array to form holes for accessing bonding pads and to singulate said ICDs; and
said singulated ICDs are maintained in array form by said first transparent element array.

16. A digital camera module workpiece according to claim 13, wherein said second transparent element array is coupled to said first transparent element array via a bonding agent.

17. A digital camera module workpiece according to claim 13, wherein said second transparent element array is coupled to said first transparent element array via mechanical interactions.

18. A digital camera module workpiece according to claim 17, wherein said mechanical interactions comprise complementary interlocking features formed on said first transparent elements and said second transparent elements.

19. A digital camera module workpiece according to claim 13, further comprising an adhesive sheet coupling said first transparent element array to said ICD wafer.

20. A digital camera module workpiece according to claim 19, wherein:
said adhesive sheet defines a plurality of apertures, each said aperture positioned over said imager of a respective one of said ICDs; and
each of said plurality of apertures is at least as large as the larger of a perimeter of said imager of said respective one of said ICDs and a lens portion of said first transparent element positioned over said respective one of said ICDs.

21. A digital camera module workpiece according to claim 19, wherein:
said adhesive sheet is directly adhered to both a top surface of said ICD wafer and a bottom surface of said first transparent element array; and
said first transparent element array includes an array of lens elements.

22. A digital camera module workpiece according to claim 19, wherein said adhesive sheet includes waterproof material.

23. A digital module workpiece according to claim 19, wherein said adhesive sheet includes opaque material.

* * * * *